United States Patent [19]
Hirabayashi

[11] Patent Number: 5,541,423
[45] Date of Patent: Jul. 30, 1996

[54] MONOCRYSTALLINE DIAMOND SEMICONDUCTOR DEVICE AND SEVERAL ELECTRONIC COMPONENTS EMPLOYING SAME

[75] Inventor: Keiji Hirabayashi, Tokyo, Japan

[73] Assignee: Canon Kabushiki Kaisha, Tokyo, Japan

[21] Appl. No.: 278,104

[22] Filed: Jul. 20, 1994

Related U.S. Application Data

[63] Continuation of Ser. No. 979,059, Nov. 19, 1992, abandoned.

[30] Foreign Application Priority Data

Nov. 21, 1991 [JP] Japan ................................. 3-331591
Nov. 29, 1991 [JP] Japan ................................. 3-339371

[51] Int. Cl.⁶ ................... H01L 31/0312; H01L 29/22; H01L 27/155
[52] U.S. Cl. ............... 257/77; 257/76; 257/78; 257/79; 257/80; 257/82
[58] Field of Search .................. 257/77, 76, 79, 257/80, 82, 78

[56] References Cited

U.S. PATENT DOCUMENTS

| | | | |
|---|---|---|---|
| 5,063,421 | 11/1991 | Suzuki et al. | 357/17 |
| 5,117,267 | 5/1992 | Kimoto et al. | 357/16 |
| 5,124,779 | 6/1992 | Furukawa et al. | 357/67 |
| 5,132,749 | 7/1992 | Nishibayashi et al. | 357/15 |
| 5,144,380 | 9/1992 | Kimoto et al. | 357/22 |
| 5,243,199 | 9/1993 | Shidmi et al. | 257/77 |
| 5,285,078 | 2/1994 | Mimura et al. | 257/59 |

FOREIGN PATENT DOCUMENTS

| | | |
|---|---|---|
| 59-208821 | 11/1984 | Japan . |
| 59-213126 | 12/1984 | Japan . |
| 60-246627 | 12/1985 | Japan . |
| 3167970 | 7/1988 | Japan . |
| 0397275 | 4/1991 | Japan . |

OTHER PUBLICATIONS

Jap. J. Appl. Phys. vol. 28, No. 10, Oct. 1989, pp. L1848–L1850, Taniguchi et al. "Blue Electroluminescence of Thin-Film Diamond etc."

*Primary Examiner*—Sara W. Crane
*Assistant Examiner*—Valencia Martin Wallace
*Attorney, Agent, or Firm*—Fitzpatrick, Cella, Harper & Scinto

[57] ABSTRACT

A diamond semiconductor device has a pn junction formed by a p-type diamond semiconductor portion containing boron as an impurity and an n-type diamond semiconductor portion containing lithium as an impurity. The diamond semiconductor is formed by a diamond crystal growth on a single nucleation site on an insulating substrate. Electroluminescene takes place in the diamond crystal.

12 Claims, 7 Drawing Sheets

MONOCRYSTALLINE DIAMOND SEMICONDUCTOR DEVICE AND SEVERAL ELECTRONIC COMPONENTS EMPLOYING SAME

This application is a continuation, of application Ser. No. 07/979,059, filed Nov. 19, 1992, now abandoned.

BACKGROUND OF THE INVENTION

1. Field of the Invention

The present invention relates to a diamond semiconductor device and also to a method of producing the same. More particularly, the present invention is concerned with a diamond semiconductor device having an electroluminescence device which includes a luminescent layer made of a diamond crystal.

2. Description of the Related Art

In general, a diamond exhibits a band gap of about 5.4 eV which is much greater than that of silicon, as well as a large mobility of holes. In addition, mobility of electrons is as large as that exhibited by silicon. Furthermore, a diamond has a small specific dielectric constant and large thermal conductivity. For these reasons, a diamond is considered to be very useful as a semiconductor material.

Under this circumstance, studies have been made on semiconductors using diamonds prepared by vapor phase synthesis. For instance, methods of forming semiconductor devices using diamond films are disclosed in Japanese Patent Laid-Open Publication Nos. 59-208821, 59-213126 and 60-246627. A report also has been made concerning Schottky barrier diodes which utilize a rectification effect between a metal and a p-type semiconductor diamond, as in a Extended Abstracts (The 50th Autumn Meeting, 1989); The Japan Society of applied Physics, pp 383–384, lecture Nos. 28a-E-7, 28a-E-8 and 28a-E-9.

In regard to an electroluminescence device (referred to as an "EL device", hereinunder) which employs a luminescent layer made of diamond crystal formed by vapor phase synthesis, the present inventors have proposed an EL device having double-insulation structure in JAPANESE JOURNAL OF APPLIED PHYSICS, Vol. 28, No. 10, pp L1848 to L1850 (1989). A Schottky type light emitting diode also has been proposed by Nishibayashi et al., in a Extended Abstracts (The 36th Spring Meeting, 1989); The Japan Society of Applied Physics and Related Societies, 2a-N-8, p 481, 1989.

The known semiconductor devices using diamond, however, could not provide satisfactory characteristics. For instance, the level of the operation current is undesirably limited when the devices have pn junctions, which are basic constructions in semiconductor devices. This is mainly attributed to the fact that n-type semiconductors having low resistance levels are difficult to obtain with diamond.

Japanese Patent Laid-Open Publication Nos. 59-208821, 59-213126 and 60-246627 disclose various methods for obtaining n-type semiconductors, such as ion implantation of phosphorus, arsenic or antimony into a diamond, and doping of diamond with a material gas containing a hydrogenated compound of the above-mentioned substances. Doping with such an element, however, generally results in a high resistance value of $10^2 \Omega.cm$ or greater, failing to meet the demand for low resistance values (not greater than several tens of $\Omega.cm$). Thus, it has been impossible to produce a pn junction type diamond semiconductor device which can operate with a large electric current, by using an n-type semiconductor doped with phosphorus, arsenic and antimony.

A Schottky barrier diode, which has a rectification function similar to that of pn junction, undesirably has inferior dielectric strength against backward current and exhibits a large leak of backward electric current. Furthermore, this type of diode cannot be produced with a high degree of reproducibility, due to the fact that the rectification characteristic has a large dependency on the state of the interface between the metal and the diamond semiconductor.

Furthermore, production of a Schottky light emitting diodes requires an impractically high production cost, because it essentially employs homo-epitaxial growth on a diamond single crystal substrate which is formed by a high-pressure synthesis process.

The aforementioned EL device proposed by the present inventors employs a ploy crystalline diamond formed on an ordinary silicon wafer so that it can conveniently be mass-produced at a low cost. In putting this EL device to practical use, however, the following problems have been encountered in some cases.

Figure 10:
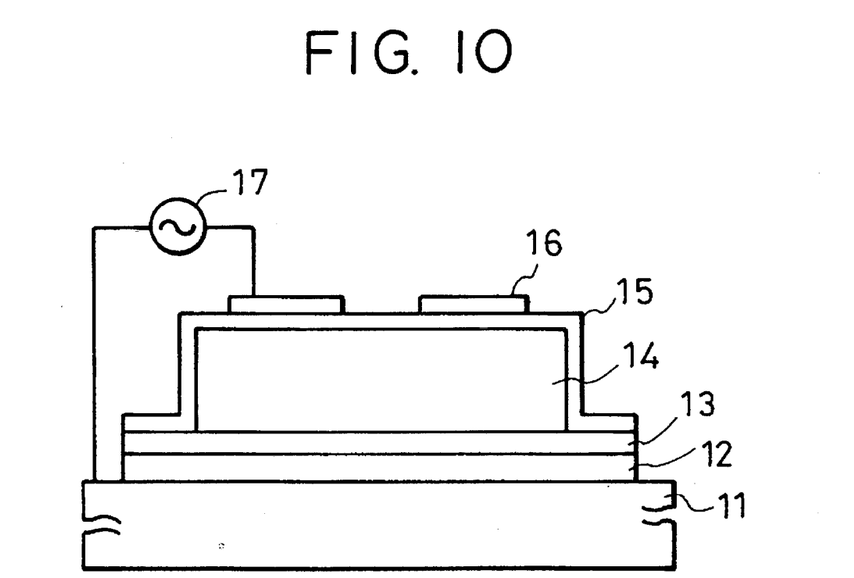
FIG. 10 is a schematic illustration of a known electroluminescence device.

FIG. 10 shows an EL device having a double-insulation layer structure proposed by the present inventors. This device has a diamond layer 14 which is sandwiched between insulating layers 12, 13 and 15 as illustrated. The lower insulating layers 12 and 13 under the diamond luminescent layer 14 are undesirably subjected to ions and radical seeds containing hydrogen, oxygen and carbon at a high temperatures of 800° C. or higher during the formation of the diamond luminescent layer 14. Consequently, these insulating layers are damaged and suffer from degradation in their insulating effect, i.e., reduction in insulating dielectric strength, resulting in a degradation in the durability of the EL device as a product.

Furthermore, the use of poly crystalline diamond as an the luminescent layer causes problems such as the consequent impediment to movement of electrons at grain boundaries. In addition, an amorphous carbon or graphite phase in the grain boundaries allows leakage of electric current, resulting in problems such as impairment of luminescence and durability of the device.

SUMMARY OF THE INVENTION

Accordingly, an object of the present invention is to provide a pn junction diamond semiconductor which can operate with a large electric current and which exhibits superior pn junction characteristics, as well as high durability.

Another object of the present invention is to provide an electroluminescence device having high insulation dielectric strength.

To these ends, according to one aspect of the present invention, there is provided a diamond semiconductor device having a diamond semiconductor with a pn junction formed by a vapor phase synthesis process, comprising: a p-type semiconductor portion containing boron as an impurity; and an n-type semiconductor portion containing lithium as an impurity.

These and other objects, features and advantages of the present invention will become clear from the following description of the preferred embodiments taken in conjunction with the accompanying drawings.

DESCRIPTION OF THE PREFERRED EMBODIMENTS

Preferred embodiments of the present invention will be described hereinunder.

According to the present invention, a diamond semiconductor device of the present invention employs a pn junction between a p-type semiconductor portion which contains boron as an acceptor and an n-type semiconductor portion which contains lithium as a donor.

In a preferred form of the method of the invention for producing a diamond semiconductor, a diamond semiconductor device having a pn junction is produced by a process comprising the steps of introducing boron as an impurity into a p-type semiconductor portion, and introducing lithium as an impurity into n-type semiconductor portion.

In another form of the method of the invention for producing a diamond semiconductor, a diamond crystal which forms a semiconductor portion is grown on the basis of a single nucleus formed on an insulating substrate.

The invention will be more fully understood from the following description.

According to the invention, a diamond pn junction semiconductor device, operable with a large operation current and exhibiting a high dielectric strength, as well as small leakage, against backward current, can be produced by vapor phase synthesis, by realizing a pn junction formed by a p-type semiconductor portion containing boron as an acceptor and an n-type semiconductor portion containing lithium as a donor.

The present inventors have discovered that an n-type semiconductor containing lithium as a donor exhibits a lower level of resistance than n-type semiconductor which contains nitrogen or phosphorous as the donor, and that a pn junction semiconductor having an n-type semiconductor containing lithium as a donor exhibits superior diode characteristics.

First Embodiment

A description will now be given of an embodiment of the method of the invention for producing a diamond semiconductor having a pn junction.

According to the invention, the diamond can be prepared, although not exclusively, by a known method such as microwave plasma CVD (Chemical Vapor Deposition), RF plasma CVD, thermal filament CVD and D.C. plasma CVD, as well as by methods which are modifications or improvements in these known methods.

Production of the p-type semiconductor employs introduction of boron into diamond. This can be done, for example, by using a material gas containing diborane ($B_2H_6$), boron trifluoride ($BF_3$), or boron tribromide ($BBr_3$). Alternatively, when a liquid organic compound such as acetone or alcohol is used as a carbon source, boric acid ($H_3BO_3$) is added into the liquid organic compound.

Production of the n-type semiconductor employs introduction of lithium into the material gas, either by heating and evaporating solid or liquid lithium or a lithium compound or, when a liquid organic compound is used as the carbon source, adding lithium or a lithium compound to the liquid organic compound.

The contents of boron and lithium in the material gases should be determined on the basis of the level of the resistance value of the diamond to be obtained. In general, however, the boron and lithium contents in terms of ratio to carbon, i.e., B/C and Li/C, range between $10^{-2}$ and $10^{-8}$.

In order to obtain an n-type diamond layer having a specifically low level of resistance, e.g., several to several tens of $\Omega$.cm, the content ratio Li/C is preferably determined to be $10^{31\ 5}$ or greater and more preferably $10^{-4}$ or greater.

The pn junction semiconductor of the present invention can be used not only for diodes but also for a wide variety of devices such as transistors having pnp or npn junctions, light emitting diodes and electron emission devices.

The known EL devices of the type shown in FIG. 10 sometimes showed extremely inferior durability, e.g., several tens of minutes of life, according to the samples or forming conditions. The present inventors have made an intense study to find reasons of such rapid breakdown of the devices, and discovered that:

1) the underlying insulating layer does not have sufficient thickness so that breakdown is undesirably triggered in such underlying insulating layer, and that 2) breakdown very often occurs through the grain boundaries of the luminescent layer made of diamond crystal.

The breakdown triggered by the underlying insulating layer is considered to be attributable to the aforesaid damage of the underlying insulating layers 12, 13 incurred during formation of the diamond luminescent layer 14 thereon. More specifically, the diamond luminescent layer 14 is formed at a high temperature of 800° to 900° C. by microwave plasma CVD, employing plasma of a material gas containing hydrogen, methane and oxygen. Consequently, the insulating layers tend to be partly damaged or etched, with the result that the insulating nature is seriously impaired to trigger breakdown when a voltage is applied thereto. This problem would be overcome by increasing the thickness of the insulating layer, but such a measure is not recommended because the increased thickness of the insulating layer reduces adhesion between the insulating layer and the underlying substrate 11.

The breakdown occurring at the grain boundaries is considered to be attributable to presence of an amorphous or graphite phase which exists in the grain boundary of the diamond luminescent layer. The diamond crystal possesses a very high dielectric strength, e.g., several MV/cm or higher, but amorphous carbon generally has a dielectric strength which is as small as 1/100 to 1/1000 that of diamond. Moreover, the graphite phase is electrically conductive. These non-diamond phases very often appear in grain boundaries, triggering breakdown of insulation under application of a voltage.

As a result of an intense study, the present inventors have found that a remarkable improvement in the insulation dielectric strength can be attained when a luminescent layer is formed on a predetermined portion of an insulating substrate with diamond crystal grown from a single nucleus.

The present invention is based upon this discovery.

The EL device in accordance with the present invention may be realized either in the form of a light emitting diode employing Schottky junction or in the form of an electroluminescent device having an insulating layer on a diamond luminescent layer, depending on the forms and arrangement of the electrodes.

The "diamond crystal formed from a single nucleus" in this specification covers not only a single crystal diamond grain but also a spinel twin-crystal grain in which the {111} plane serves as twin crystal plane, as well as multi-twin crystal grains composed of 5 and 20 piece single crystals having the {111} plane as the twin-crystal plane. The diamond crystal formed from a single nucleus exhibits dielectric breakdown strength greater than that of polycrystalline diamond grains formed from a plurality of nuclei, because it has no grain boundary.

Second Embodiment

A detailed description will be given of an EL device of the present invention employing a diamond semiconductor formed in accordance with the method of the present invention.

Figure 1:
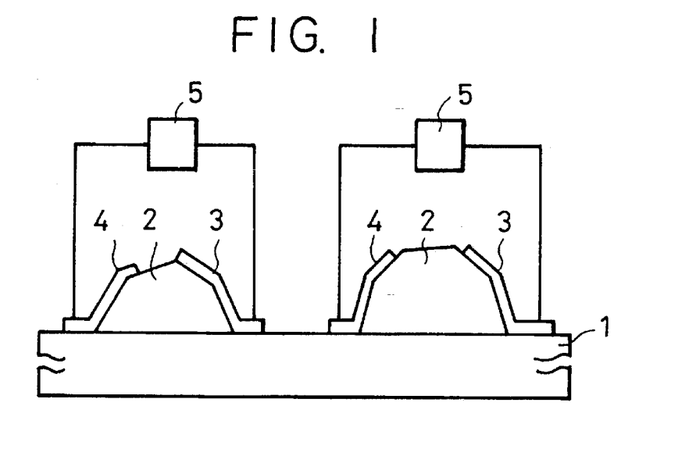
FIG. 1 is schematic illustration of an electroluminescence device in accordance with the present invention.
Figure 2:
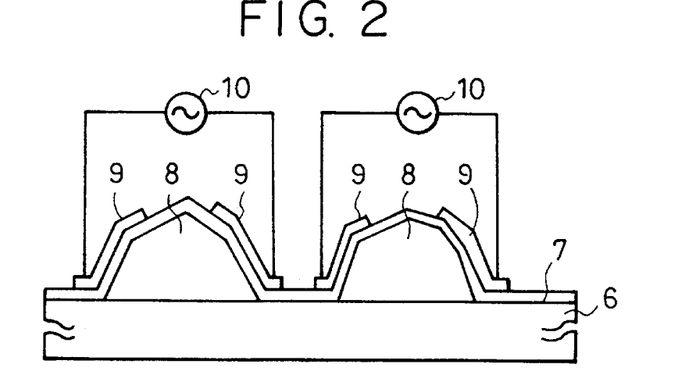
FIG. 2 is a schematic illustration of another electroluminescence device in accordance with the present invention.

FIGS. 1 and 2 are schematic illustrations of an EL device in accordance with the present invention. Referring to these Figures, an insulating substrate 1 may be formed from a material such as quartz, glass, $Al_2O_3$, MgO, $ZrO_2$, $SrTiO_3$, or $CaF_2$. The insulating substrate 1 should be stable even at a high temperature of 500° to 900° C. to which the temperature of the substrate may rise during formation of the diamond crystal on the substrate 1.

Numerals 2 and 8 in these Figures denote luminescent layers formed of diamond crystals by, for example, microwave plasma CVD, thermal filament CVD, DC plasma CVD, ECR plasma CVD or a flame burning method.

The carbon-containing gas suitably used in the synthesis of the diamond may be selected from a group consisting of: hydrocarbons such as methane, ethane, propane, ethylene, benzene and acetylene; carbon halides such as carbon tetrachloride, chloroform and trichloroethane; alcohols such as methyl alcohol and ethyl alcohol; $CO_2$; CO and gases formed by adding $N_2$, $H_2$, $O_2$, $H_2$, Ar (argon) or the like to the above-mentioned gases, as well as gases formed by diluting these gases.

The diamond luminescent layer 2 or 8 has to be formed on a predetermined location on a substrate from a single nucleus. Although not exclusively, the selective deposition of diamond from a single nucleus may be conducted in accordance with a method which is disclosed in Japanese Patent Laid-Open Publication No. 2-30697.

The above-mentioned selective deposition method comprises the steps of effecting abrading treatment on the substrate surface, forming a patterned mask on the substrate, effecting an etching through the mask, and removing the mask, whereby the abraded portions of the substrate surface are left in accordance with the pattern. Alternatively, the abraded substrate surface may be left in accordance with a pattern by a process having the steps of providing a mask of a predetermined pattern on the substrate, effecting treatment on the substrate surface, and removing by etching the patternized mask. The process also may be such that, after effecting the abrading treatment on the substrate surface, a heat-resistant mask of a predetermined pattern is formed, whereby the abraded area of the substrate surface is left in a specific pattern.

The above-described abrading treatment is conducted preferably by employing diamond grains, but may be effected by supersonic treatment or by sand blasting. For instance, abrading of an Si single crystal substrate by a lateral grinding device employing diamond grains of 1 μm or smaller causes production of nuclei at a density of $10^7/cm^2$ or greater. The abrading with supersonic waves is preferably effected by immersing the substrate in a liquid in which grains of 1 to 50 μm are dispersed, and applying supersonic waves by, for example, a supersonic washing device for a period of 5 minutes to 4 hours, preferably from 10 minutes to 2 hours. With this method also, it is possible to obtain a nuclei density of $10^7/cm^2$ or greater.

A description will now be given of an example of a method for effecting selective deposition of diamond by abrading a substrate in a predetermined pattern with diamond grains, with specific reference to FIGS. 4(a) to 4(e).

Figure 4A:
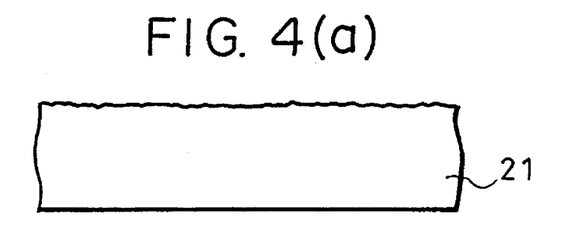
FIGS. 4(a) to 4(d) are schematic illustrations of a method of forming a diamond crystal using a single nucleus.

As the first step, the surface of a substrate 21 is uniformly abraded with diamond grains, as shown in FIG. 4(a).

Figure 4B:
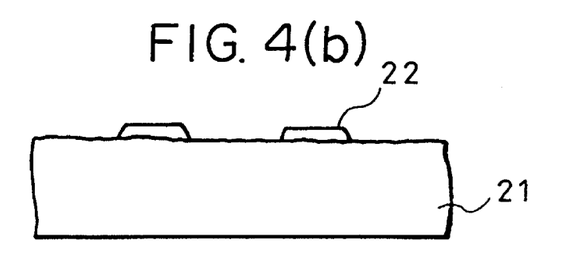

Then, a mask 22 is formed on the surface of the substrate 21, as shown in FIG. 4(b). The mask may be formed of any suitable material. For instance, the mask may be formed of a resist patternized by a photolithographic method.

In order that a diamond grain is formed from a single nucleus, it is necessary that the area of the mask is not greater than 10 μm². If this area is exceeded, a plurality of nuclei will appear on the mask pattern, allowing generation of polycrystalline diamond.

Figure 4C:
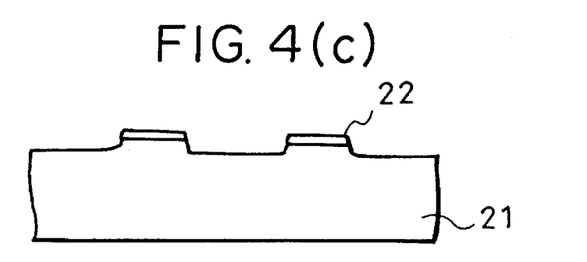

Subsequently, the substrate 21 is etched through the mask 22, so that the abraded portions of the substrate surface are left in accordance with the pattern of the mask, as shown in FIG. 4(c). The etching may be either dry etching or wet etching. When wet etching is selected, a mixture of fluoric acid and nitric acid may be used as the etchant. When dry etching is adopted, the etching may be conducted by using a known technique such as, for example, plasma etching and ion beam etching. The etching gas employed in plasma etching may be $CF_4$ gas with or without addition of oxygen, argon or the like. The ion beam etching may employ an etching gas such as a thin gas, e.g., Ar(argon), helium (He) and neon (Ne), as well as other gases such as oxygen, fluorine, hydrogen and $CF_4$. The etching depth is 100 Å or greater, preferably 500 to 10000 Å and more preferably 800 to 2000 Å.

Figure 4D:
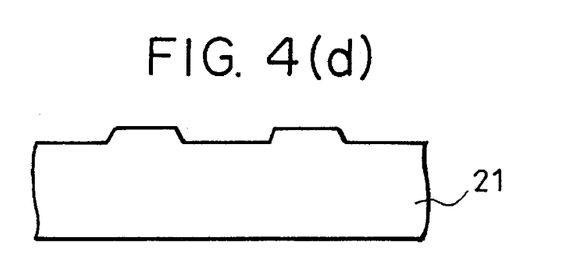
Figure 4E:
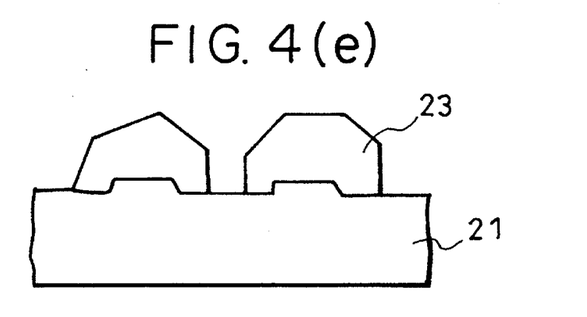

Subsequently, the mask 22 is removed as shown in FIG. 4(d), and vapor phase synthesis process is executed, so that diamonds 23 are selectively formed on the abraded portions of the substrate surface, as shown in FIG. 4(e).

It is possible to add a trace amount of an element to the diamond layer. Such element forms a luminescence center so that light is emitted in a color centered at this luminescence center. Examples of such elements usable as the luminescence center at the short-wavelength region, i.e., the blue, violet and region, are: B, Te, As, Au, Mg, P, Sb, Si, Ta, Cu and N. For the light of colors in the long-wavelength region, i.e., for red and infrared, luminescence center elements are suitably used such as Tl, Ba, Li, Cd, Cs, In, Ra, S, Sr, Ti, Zn, Ca, Ce, Co, Cr, Fe, Ga, K, Mn, Nb, Os, Pb, Rb, Rh, Sc, Th, V, W and Y. As the luminescence center elements for the intermediate wavelength region, between the above-mentioned two regions, suitably used are Ag, Be, Bi, Cu, Ge, Hg, Pt, Re, Zr, Al, Ir, Ni, Ru, Sn, Tb and O. These elements may be used in the form of a halide, a sulfide or an oxide. The introduction of the trace amount of such element may be effected by adding such element to the material gas or by ion implantation.

It is to be noted that, even if such trace amount of element is not added, light emission is observed at a region around, for example, 430 nm in terms of wavelength, due to a slight dislocations or defects which may exist in the crystal.

Then, electrodes are formed on the diamond crystal formed on a single nucleus. Two types of EL devices are obtainable according to the arrangement of the electrodes. More specifically, FIG. 1 shows a light emitting diode having a Schottky junction, while FIG. 2 shows an electroluminescence device having an insulating layer type structure employing an insulating layer formed on the diamond crystal.

The light emitting diode shown in FIG. 1 has a Schottky junction electrode 3 and an ohmic contact electrode 4. The materials of these electrodes are selected in accordance with the states of the surface of the diamond crystal, e.g., cleanliness or any adsorbed nucleus. Generally, however, a material having a large work function provides an ohmic contact, while a material having a small work function provides a Schottky junction, when used in a p-type diamond. Conversely, in n-type diamond, a material having a large work function provides a Schottky junction, while a material having a small work function provides an ohmic junction.

The Schottky electrode 3 and the ohmic electrode 4 are formed on the diamond crystal 2 so as not to overlap one on the other.

Luminescence takes place in a portion of the device near the Schottky electrode 3 when a forward voltage is applied by a D.C. power supply 5 between the Schottky electrode 3 and the ohmic electrode 4. The term "forward voltage" in this case means a voltage applied such that, when the diamond crystal layer 2 is a p-type semiconductor, the Schottky junction electrode receives a negative voltage while the ohmic junction electrode 4 receives a positive voltage. Conversely, when the diamond crystal layer 2 is an n-type semiconductor, the forward voltage means such a voltage that the Schottky junction electrode is a positive electrode, while the ohmic junction electrode is a negative electrode.

Referring to FIG. 2, numeral 7 denotes an insulating layer preferably made of a material which has high transparency and breakdown voltage in the visible wavelength region and which has a large dielectric constant. Examples of such material are dielectric materials such as $SiO_2$, $Y_2O_3$, $HfO_2$, $Si_3N_4$, $Al_2O_3$, $Ta_2O_5$, $PbTiO_3$, $BaTa_2O_6$ and $SrTiO_3$. Using such a dielectric material, the insulating layer 7 is formed to have a thickness of 500 to 5000 Å by a method such as vacuum evaporation, ion plating, sputtering, spraying and CVD.

Numeral 9 in FIG. 2 denotes electrodes which may be formed of a metal, a semiconductor or a transparent conductive film. The electrodes 9 also can be formed to have a thickness of 500 to 2000 Å by using one of the techniques just mentioned.

Two such electrodes 9 are separately formed on the diamond crystal 8 such that they do not overlap each other. Luminescence takes place in the diamond luminescent layer 8 by applying, between these electrodes 9, a D.C.voltage. an A.C. voltage or a composite voltage having D.C.and A.C. components.

The present invention will now be described in detail by examples.

EXAMPLE 1

An example of an EL device according to the present invention, such as that shown in FIG. 1, was produced in the following manner.

A quartz substrate 1 (diameter: 25 mm, thickness: 0.5 mm) was placed in a dispersion of diamond grains of an average grain size of 15 μm in alcohol, and the substrate 1 was subjected to abrading by using an ultrasonic cleaner.

Subsequently, polymethyl methacrylate (PMMA) resist patterns of a diameter of 2 μm were formed at a pitch of 20 μm on the abraded surface of the substrate 1 by using a mask aligner (trade name "PLA 500"; produced by Canon Inc. ).

The masked surface of the substrate 1 was etched to a depth of approximately 1200 Å by using an Ar ion beam etching apparatus. The etching was conducted for a period of 10 minutes at an acceleration voltage of 1 kV.

Subsequently, the resist was removed by using an organic solvent. The resultant substrate 1 was introduced into a microwave plasma CVD apparatus, shown in FIG. 5, to be subjected to diamond formation.

Figure 5:
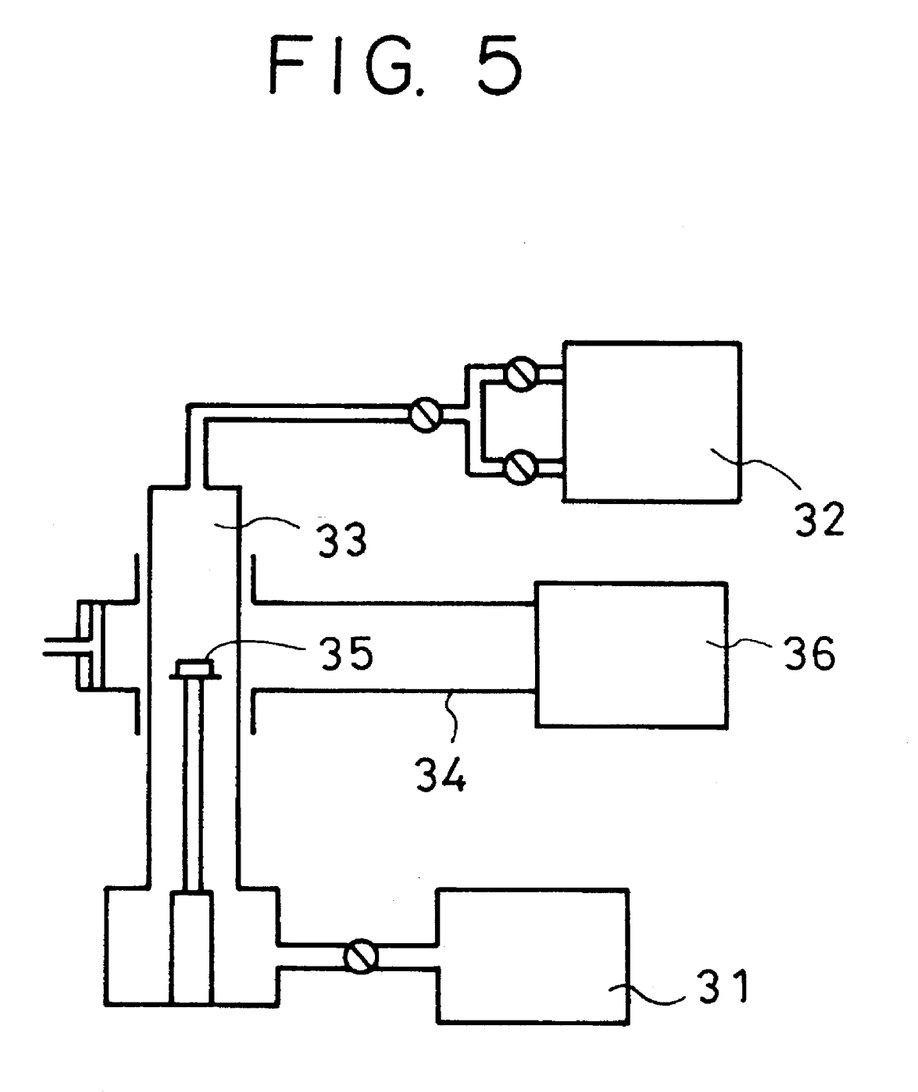
FIG. 5 is a schematic illustration of a synthesis apparatus for forming a diamond crystalline luminescent layer.

In the apparatus shown in FIG. 5, a reaction chamber 33 was exhausted to a level of $1 \times 10^{-7}$ Torr by an exhaustion system 31. Then, the following gases were introduced from a gas supply system 32 into the reaction chamber 33 at the following flow rates: $CH_4$: 1.5 SCCM; $H_2$: 200 SCCM; $O_2$: 0.5 SCCM; and $B_2H_6$ (diluted with hydrogen at a concentration of 100 ppm): 1 SCCM. The internal pressure of the apparatus was adjusted to 60 Torr, and microwave discharge was caused by a microwave generator 36 at a frequency of 2.45 GHz. A synthesis period of 8 hours was consumed for diamond formation.

The diamond formation resulted in diamond crystals 2 (shown in FIG. 1) of approximately 10 μm being grown, each around a single nucleus. The diamond crystals 2 were selectively formed only on those portions of the substrate-surface which remained abraded (portions which had been covered with the resist).

Subsequently, an Al electrode as a Schottky electrode 3 and a Au electrode as an ohmic electrode 4 were formed with a thickness of approximately 1000 Å on each diamond crystal 2 by a vacuum deposition method in such a manner that these electrodes 3 and 4 did not overlap each other.

When voltage was applied between the Al (Schottky) electrode 3 and the Au (ohmic) electrode 4 in the forward direction (Al electrode: negative, Au electrode: positive), emission of blue light at a wavelength of 440 nm or thereabout was observed.

One hundred devices of the same type as above were produced, and subjected to 100-hour durability tests. As a result, each device showed no deterioration, such as reduction in brilliance or breakdown of the device. Thus, it was proved that the devices had good durability.

EXAMPLES 2 to 5,

Comparison Example 1

The pattern diameter of the mask for selective growth was varied in order to examine the influence of that diameter on the durability of single-crystal diamond grains (including twin-crystal grains), each grown around a single nucleus, and that of poly-crystalline diamond grains, grown around a plurality of nuclei.

Various types of EL devices were produced in exactly the same manner as that in Example 1 except that various pattern diameters of the masks for selective growth were adopted. Each of the thus produced devices had a relationship between the single-crystallization ratio of the diamond crystal(s) and the durability, shown in Table 1.

It is seen from Table 1 that Examples 2 to 5 having high single-crystallization ratios possessed good durability.

TABLE 1

|  | PATTERN DIAMETER OF SELECTIVE-GROWTH MASK | SINGLE-CRYSTALLI-ZATION RATIO OF DIAMOND CRYSTAL | DURA-BILITY |
|---|---|---|---|
| EXAMPLE 2 | 1.5 μm | ⊚ | ⊚ |
| EXAMPLE 3 | 2.5 μm | ⊚ | ⊚ |
| EXAMPLE 4 | 3.0 μm | ○ | ○ |
| EXAMPLE 5 | 3.5 μm | Δ | Δ |
| COMPARISON EXAMPLE 1 | 4.0 μm | X | X |

⊚: very good; ○: good; Δ: usable; X: poor

Comparison Example 2

Other EL devices were produced in exactly the same manner as that in Example 1 except that each device included a Si semiconductor substrate (n-type; resistivity: 0.1 Ω.cm) having a 2000 Å-thick, $SiO_2$ film formed on the surface thereof.

The $SiO_2$ films of some of the devices were damaged by high temperature and plasma during diamond crystal formation. As a result, these devices had insufficient insulation between the Si substrates and the Al or Au electrodes. When one hundred devices of this type were subjected to 100-hour durability tests, 32 devices became unusable due to insufficient insulation.

EXAMPLE 6

Another example of an EL device according to the present invention, such as that shown in FIG. 2, was produced in the following manner.

A quartz substrate 6 (diameter: 25 mm, thickness: 0.5 mm) was subjected to the same abrading, resist-pattern forming, and etching as those in Example 1

The resultant substrate was introduced into a heat filament CVD apparatus, and subjected to diamond formation. The diamond formation adopted conditions consisting of: $CH_4$: 2 SCCM; $H_2$: 200 SCCM; $O_2$: 0.75 SCCM; internal pressure: 100 Torr; substrate temperature: 850° C.; filament temperature 2000° C.; and synthesis period: 8 hours. The diamond formation resulted in diamond crystals 8 (shown in FIG. 2) of approximately 8 μm, being grown, each around a single nucleus. The crystals were selectively formed only on those portions of the substrate-surface which remained abraded (portions which had been covered with the resist).

Subsequently, an insulating layer 7 was formed on the exposed surface of the substrate 1 and the surface of the diamond crystals 8 by depositing hafnium oxide ($HfO_2$) with a thickness of 2000 Å by an ion plating method.

Subsequently, a pair of Al electrodes 9 were formed with a thickness of approximately 1000 Å at different positions on each diamond crystal 8 in such a manner that these electrodes 9 did not overlap each other. When an AC voltage of 1 kHz was applied between the Al electrodes 9, emission of blue light around 430 nm was observed.

One hundred devices of the same type as above were produced, and subjected to 100-hour durability tests. As a result, each device showed no deterioration, such as reduction in brilliance or breakdown of the device. Thus, it was proved that the devices had good durability.

EXAMPLES 7 to 10,

Comparison Example 3

The pattern diameter of the mask for selective growth was varied in order to examine the influence of that diameter on the durability of single-crystal diamond grains (including twin-crystal grains), each grown around a single nucleus, and that of poly-crystalline diamond grains, grown around a plurality of nuclei.

Various types of EL devices were produced in exactly the same manner as that in Example 6 except that various pattern diameters of the masks for selective growth were adopted. Each of the thus produced devices had a relationship between the single-crystallization ratio of the diamond crystal(s) and the durability, shown in Table 2.

It is seen from Table 2 that Examples 7 to 10 having high single-crystallization ratios possessed good durability.

TABLE 2

|  | PATTERN DIAMETER OF SELECTIVE-GROWTH MASK | SINGLE-CRYSTALLI-ZATION RATIO OF DIAMOND CRYSTAL | DURA-BILITY |
|---|---|---|---|
| EXAMPLE 7 | 1.5 μm | ⊚ | ⊚ |
| EXAMPLE 8 | 2.5 μm | ⊚ | ⊚ |
| EXAMPLE 9 | 3.0 μm | ○ | ○ |
| EXAMPLE 10 | 3.5 μm | Δ | Δ |
| COMPARISON EXAMPLE 3 | 4.0 μm | X | X |

⊚: very good; ○: good; Δ: usable; X: poor

Comparison Example 4

Other EL devices were produced in exactly the same manner as that in Example 6 except that each device included a Si semiconductor substrate (n-type; resistivity: 0.1 Ω.cm) having a 2000 Å-thick, $SiO_2$ film formed on the surface thereof.

The $SiO_2$ films of the devices can be damaged by high temperature, hydrogen radicals, etc., during diamond crystal formation. With the construction of these devices, since $HfO_2$ films were formed as insulating layers 7 on the respective diamond crystals, the insulating ability was improved from that of Schottky-junction light-emitting diode type devices. However, when one hundred devices of the type being discussed were subjected to 100-hour durability tests, 20 devices became unusable due to insufficient insulation between the Si substrates and the Al electrodes.

EXAMPLE 11

Figure 6:
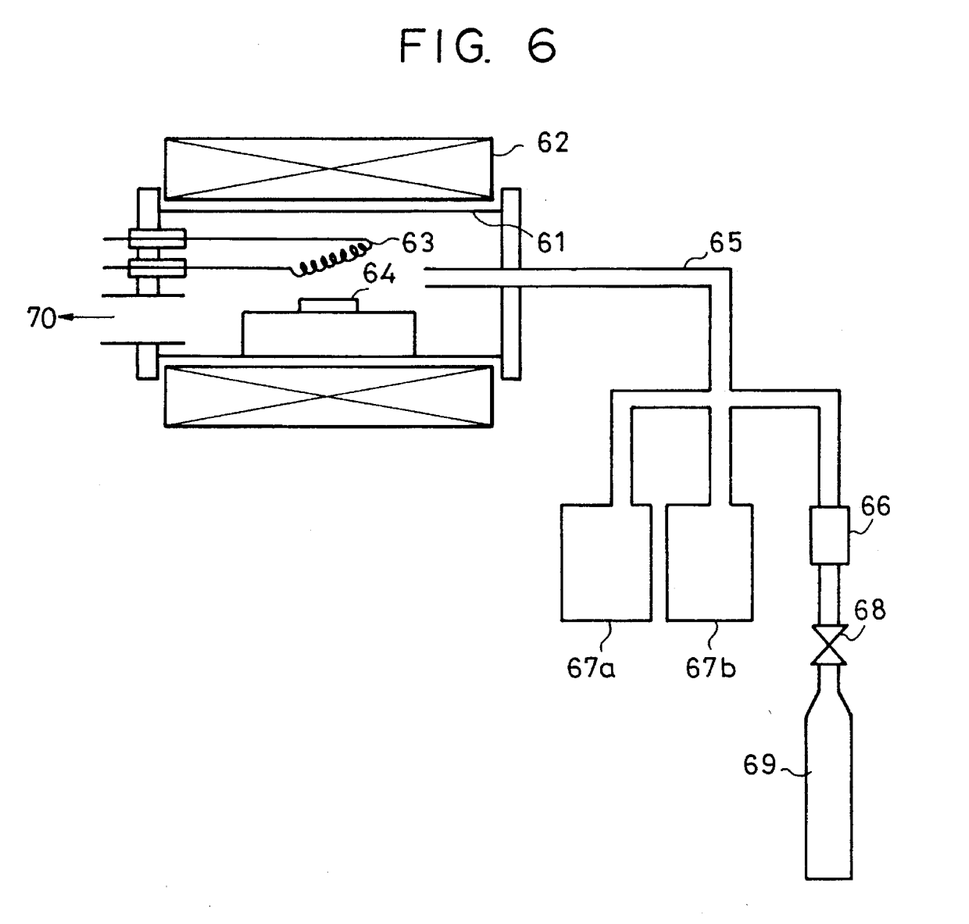
FIG. 6 is a schematic illustration of an apparatus for producing a pn junction diamond semiconductor.

FIG. 6 shows an example of an apparatus for forming a diamond semiconductor. The apparatus is a heat filament CVD apparatus, and includes a quartz reaction tube 61 disposed in an electric furnace 62, a tungsten filament 63 disposed in the reaction tube 61, a gas inlet tube 65, a flowmeter 66 for adjusting the gas flow rate, a first liquid vaporizer 67a for heating and gasifying a liquid organic compound containing lithium, a second liquid vaporizer 67b for heating and gasifying a liquid organic compound containing boron, a valve 68, a hydrogen gas cylinder 69, and an exhaust port 70 connected to a pressure adjusting valve and an exhaustion system (neither of which are shown). The apparatus is shown in the state where a substrate 64 is already set.

A diamond semiconductor was formed using the apparatus shown in FIG. 6 in the following manner. First, the first and second liquid vaporizers 67a and 67b were charged. Specifically, metal lithium was dissolved in ethanol in such a manner that the ratio (Li/C) between lithium and carbon satisfied the equation of Li/C=50 ppm ($=5\times10^{-5}$), and the solution was charged in the first liquid vaporizer 67a. Further, boric acid ($H_3BO_3$) was dissolved in ethanol in such a manner that the ratio (B/C) between boron and carbon satisfied the equation of B/C=50 ppm ($=5\times10^{-5}$), and the solution was charged in the second liquid vaporizer 67b.

A single-crystal silicon substrate 64 (p-type; resistivity: 0.1 $\Omega$cm; 15 mm square; thickness: 0.4 mm) was placed inside the quartz reaction tube 61. The interior of the quartz reaction tube 61 was evacuated to $10^{-3}$ Torr by the exhaustion system. Thereafter, the silicon substrate 64 was heated to a temperature of 800° C. with the electric furnace 62.

Then, the first liquid vaporizer 67a and the flowmeter 66 were used to introduce, into the quartz reaction tube 61, the lithium-containing ethanol and hydrogen gas at flow rates of 0.5 ml/min and 200 ml/min, respectively.

Thereafter, the pressure adjusting valve was used to adjust the internal pressure within the reaction tube 61 to 50 Torr. Then, the filament 63 was supplied with power from a power supply, not shown, and was red-heated to approximately 2100° C. The red-heated filament 63 caused decomposition of ethanol and hydrogen, thereby forming n-type diamond containing lithium on the substrate 64.

After reaction for 1 hour, the supply of the lithium containing ethanol from the first liquid vaporizer 67a was terminated. Then, the boron-containing ethanol was introduced from the second liquid vaporizer 67b under the same conditions as above except that the flow rate was 0.5 ml/min. Reactions similar to the above were caused for 1 hour, thereby forming p-type diamond containing boron on the n-type diamond containing lithium. Thus, a pn-junction diamond semiconductor was formed.

An ohmic electrode (diameter: 2 mm; thickness; approximately 2000 Å) was formed on the surface of the p-type diamond of the pn-junction diamond semiconductor by depositing gold by vacuum deposition. Further, an aluminum electrode was deposited on the backside surface of the Si substrate 64 by vacuum deposition, and the diode characteristics provided by the resultant pn-junction diamond were evaluated.

Figure 7:
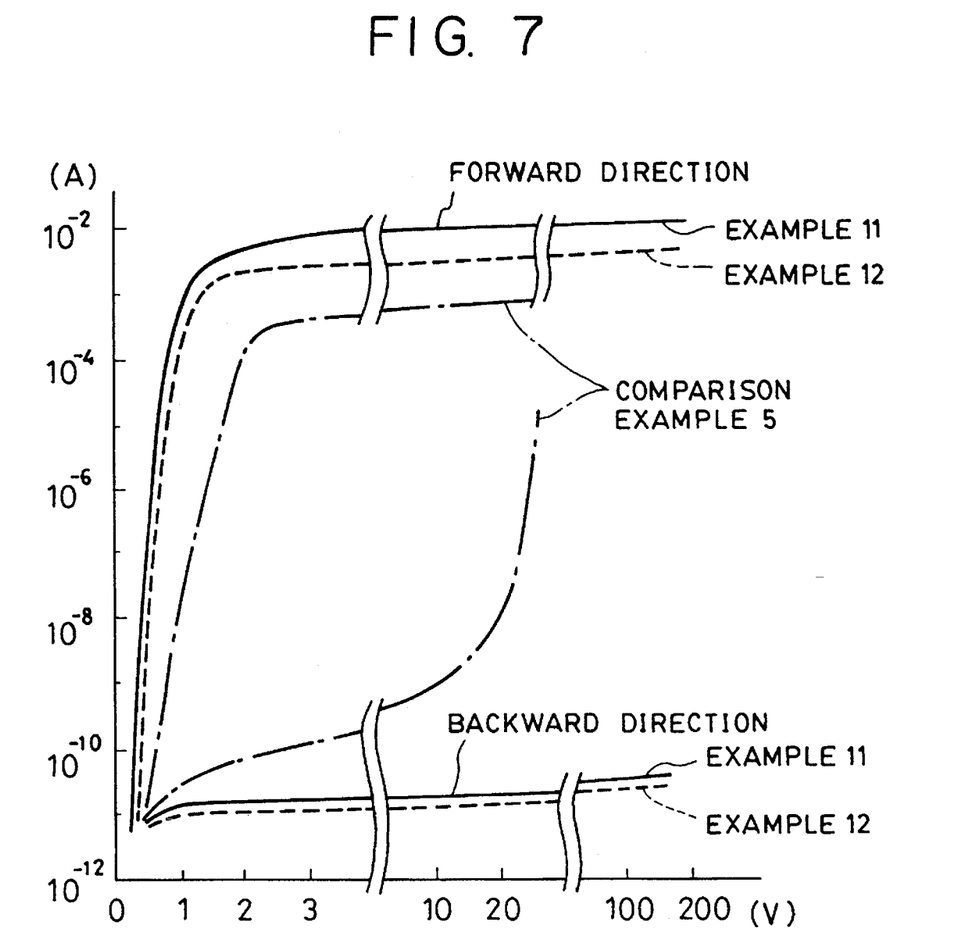
FIG. 7 is a graph showing diode characteristics of a semiconductor device.

The diode characteristics thus evaluated are indicated by solid lines in FIG. 7. The ratio in magnitude between forward current and backward current was at least $10^8$. The leakage current in the backward direction was not more than $10^{-10}$ A, and the break-down voltage was not less than 250 V. Thus, very good diode characteristics were obtained.

EXAMPLE 12

Figure 8:
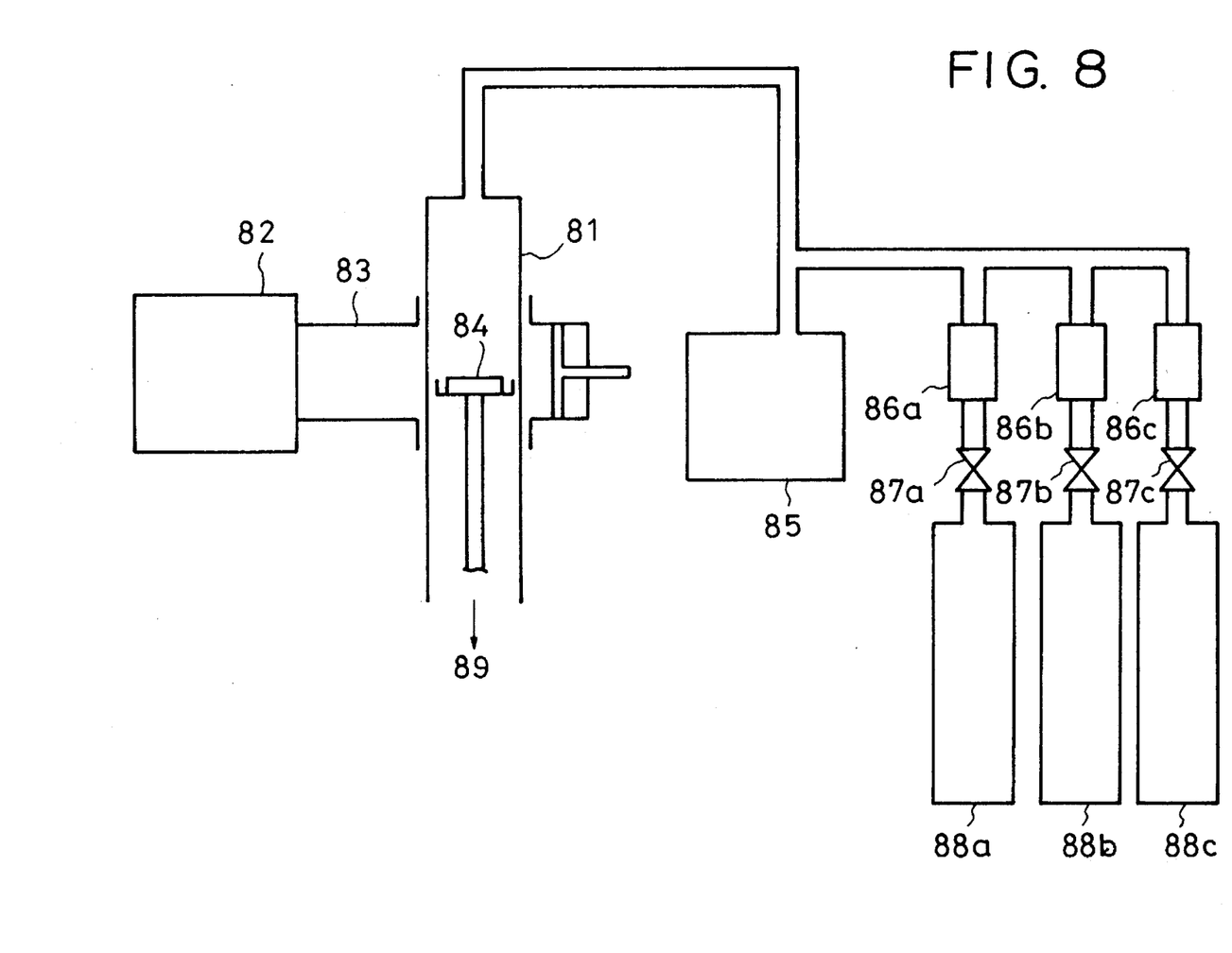
FIG. 8 is a schematic illustration of an apparatus for producing a pn junction diamond semiconductor.

FIG. 8 shows another example of an apparatus for forming a diamond semiconductor. The apparatus is a microwave plasma CVD apparatus, and includes a quartz reaction tube 81, a microwave generator 82 (frequency: 2.45 GHz), a microwave guide 83, a liquid vaporizer 85 for heating and gasifying a liquid organic compound containing lithium, a first cylinder 88a for containing hydrogen gas, a second cylinder 88b for containing methane gas, a third cylinder for containing diborane gas (diluted with hydrogen at a concentration of 10 ppm), a corresponding number of gas flowmeters 86a, 86b and 86c, a corresponding number of valves 87a, 87b and 87c, and an exhaust port 89 connected to a pressure adjusting valve and an exhaustion system (neither of which are shown). The apparatus is shown in the state where a substrate 84 is already set.

A diamond semiconductor was formed using the apparatus shown in FIG. 8 in the following manner. First, a solution of lithium chloride in acetone was prepared in such a manner that the ratio (Li/C) between lithium and carbon satisfied the equation of Li/C =100 ppm, and the solution was charged in the liquid vaporizer 85.

A single-crystal silicon substrate 84 of the same type as that used in Example 11 was placed inside the quartz reaction tube 81. The interior of the quartz reaction tube 81 was evacuated to $2\times10^{-3}$ Torr by the exhaustion system. Thereafter, the first, second and third gas cylinders 88a, 88b and 88c as well as the flowmeters 86a, 86b and 86c were used to introduce, into the quartz reaction tube 81, hydrogen, methane, and diborane at flow rates of 200 ml/min, 0.75 ml/min and 40 ml/min, respectively.

Thereafter, the pressure adjusting valve was used to adjust the internal pressure within the reaction tube 81 to 60 Torr. Then, the microwave generator 82 was used to apply microwave to the quartz reaction tube 81 (output: 0.8 kW). Thus, plasma was generated, thereby forming p-type diamond containing boron on the substrate 84.

After reactions for 3 hours, the application of microwave was interrupted, and the supply of methane gas and diborane gas was terminated.

Then, the lithium-containing acetone was introduced from the liquid vaporizer 85 at a flow rate of 0.5 ml/min, and the application of microwave was restarted to generate plasma. Reactions were caused under the following conditions: internal pressure: 60 Torr; microwave output: 0.8 kW; and hydrogen flow rate: 200 ml/min.

The reactions were conducted for 1 hour, thereby forming n-type diamond containing lithium on the p-type diamond containing boron. Thus, a pn-junction diamond semiconductor was formed.

The diode characteristics provided by the pn-junction diamond were evaluated in the same manner as in Example 11. As a result, good characteristics, indicated by broken lines in FIG. 7, were obtained.

Comparison Example 5

An Al electrode was formed as a Schottky electrode on a thin film of p-type diamond formed under the same conditions as those in Example 12, thereby producing a Schottky-junction diode. The diode characteristics of this device were evaluated.

As a result, as indicated by one-dot-chain lines in FIG. 7, leakage current in the backward direction was great, and the break-down voltage was as low as approximately 25 V.

EXAMPLE 13

Figure 9:
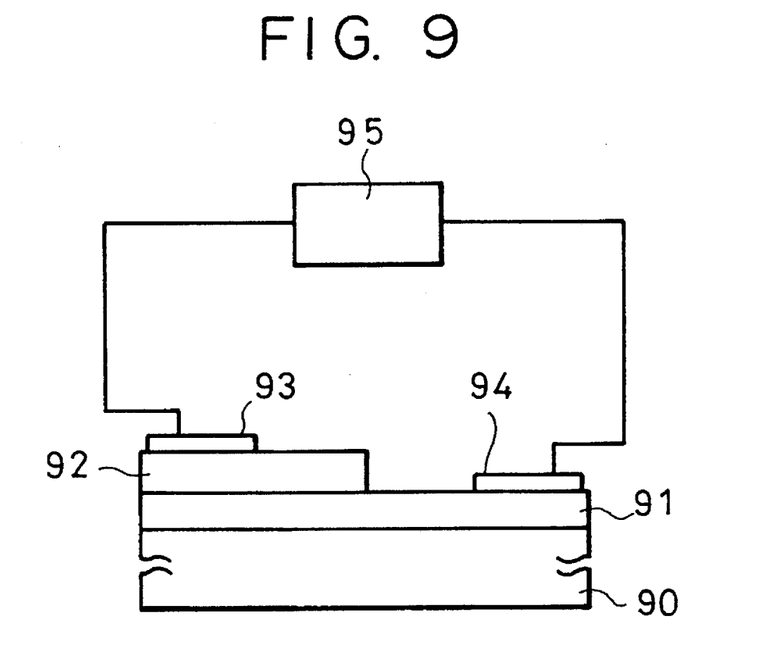
FIG. 9 is a schematic illustration of a light emitting diode formed of a pn junction diamond semiconductor.

A method of producing a light-emitting diode (LED) using a pn-junction according to the present invention will be described with reference to FIG. 9.

A Si single-crystal substrate 90 of 20 mm square and with a thickness of 0.5 mm, which was non-doped and had a resistivity of 1000 Ω.cm, was prepared as the substrate. A diamond layer was formed on the substrate by a microwave plasma CVD method similar to that in Example 12 as follows:

First, a substrate 90 of the above-described kind was introduced into an apparatus of the type shown in FIG. 8. Then, interior of the quartz reaction tube 81 was exhausted.

Subsequently, material gases, namely, hydrogen, methane and diborane gases, were introduced into the reaction tube 81 at flow rates of 200 ml/min, 1 ml/min and 20 ml/min, respectively. The internal pressure was adjusted to 50 Torr.

Thereafter, the microwave generator 82 was used to apply microwave to the quartz reaction tube 81 (output: 0.8 kW), thereby generating plasma to form a p-type diamond film layer 91 containing boron on the substrate 90.

After reactions for 2 hours, resultant substrate was taken out of the reaction tube 81. A resist pattern was formed on a part of the diamond layer 91 by a known photolithographic method, a $SiO_2$ film with a thickness of 1000 Å was formed through the resist by a known vacuum deposition method, and thereafter the resist was removed, thereby depositing $SiO_2$ on a part of the diamond film 91.

The resultant substrate 90 was again introduced into the apparatus. After the interior of the reaction tube was exhausted, the hydrogen gas cylinder 88a and the liquid vaporizer 85 were used to respectively introduce hydrogen gas and lithium-containing acetone of the above-described kind at flow rates of 200 ml/min and 0.5 ml/min. Then, the internal pressure was adjusted to 50 Torr.

Thereafter, microwave was applied (output: 0.75 kW) to generate plasma, and through reactions for 2 hours, a n-type diamond layer 92 containing lithium on a part of the p-type diamond layer 91. In the above process, substantially no diamond was deposited on that part of the diamond layer 91 covered with $SiO_2$.

The resultant substrate 90 was taken out of the apparatus, and the $SiO_2$ film was removed with a solution of hydrofluoric acid.

Then, Ag was deposited on a part of the diamond layers 91 and 92 by a known vacuum deposition method, thereby forming electrodes 94 and 93, respectively.

Thereafter, a power supply 95 was used to apply a DC voltage while the electrode 94 on the p-type diamond layer 91 constituted the positive electrode, and the electrode 93 on the n-type diamond layer 92 constituted the negative electrode. When a voltage of several to several tens of V was applied, emission of light from the pn-junction was observed. The emission of light peaked approximately at 440 nm.

EXAMPLE 14

Figure 3:
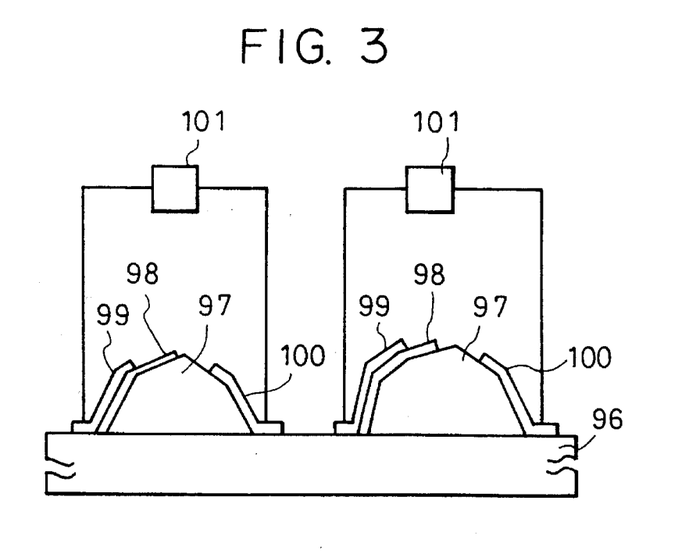
FIG. 3 is a schematic illustration of a light emitting diode using a pn junction diamond semiconductor formed with a single nucleus.

A method of producing a light-emitting diode (LED) using a pn-junction on a diamond crystal grown around a single crystal according to the present invention will be described with reference to FIG. 3.

A quartz substrate 96 (diameter: 25 mm, thickness: 0.5 mm) was prepared, and p-type, boron-doped diamond semiconductor crystals 97, each being approximately 10 μm and grown around a single nucleus, were formed on the substrate 96 by a method similar to that in Example 1.

Thereafter, a resist pattern was formed on a part of each diamond crystal 97 by a known photolithographic method, a $SiO_2$ film with a thickness of 1000 Å was formed through the resist by a known vacuum deposition method, and thereafter the resist was removed, thereby depositing $SiO_2$ on a part of each diamond crystal 97.

Thereafter, a n-type diamond layer 98 was formed by a method similar to that used to form the n-type diamond layer 92 in Example 13. Further, a positive electrode 100 and a negative electrode 99 were formed on the p-type diamond layer 97 and the n-type diamond layer 98, respectively, by methods similar to those in Example 13. A DC power supply 101 was used to apply DC voltage. When a voltage of several to several tens of V was applied, emission of light from the pn-junction was observed. The light emission peaked approximately at 440 nm.

As described above, according to the present invention, the formation of a pn-junction diamond semiconductor, in which boron is added as an acceptor (p-type) and lithium is added as a donor (n-type), makes it possible to obtain good pn-junction characteristics that will render a semiconductor device operable with large current values and excellently durable. Such a pn-junction diamond semiconductor can be used in blue-light emitting devices, high-output integrated circuits, or semiconductor devices usable at high temperatures.

As described above, an electroluminescence device including a diamond semiconductor according to the present invention has advantageous features such as the following: the device includes an insulating substrate, and is thus free from insulation failure between the electrodes and the substrate; and the diamond crystal, grown around a single nucleus, has no grain boundary therein, thereby assuring very high withstand voltage. Thus, the durability of the device can be greatly improved.

What is claimed is:

1. A diamond semiconductor device having a diamond crystal semiconductor comprising a diamond crystal grain grown from a single nucleus at a predetermined location on an insulating substrate not containing a diamond crystal, and which functions as a luminescence layer.

2. A diamond semiconductor device according to claim 1, further comprising a Schottky junction electrode and an ohmic junction electrode separately formed on said diamond crystal layer, and means for applying a forward voltage between said electrodes, whereby electroluminescene takes place in said diamond crystal layer.

3. A diamond semiconductor device according to claim 1, further comprising an insulating layer formed on said diamond crystal layer, a first electrode and a second junction electrode separately formed on said insulating layer and means for applying a forward voltage between said electrodes, whereby electroluminescene takes place in said diamond crystal layer.

4. A diamond semiconductor device according to claim 1, wherein said diamond semiconductor has a pn junction comprising:

A p-type semiconductor portion containing boron as an impurity; and a n-type semiconductor portion containing lithium as an impurity.

5. A diamond semiconductor device according to claim 1, wherein said diamond crystal grain grown from said single nucleus comprises a single crystal diamond grain.

6. A diamond semiconductor device according to claim 1, wherein said diamond crystal grain grown from said single nucleus comprises a spinel twin-crystal grain in which a {1,1,1} plane as a twin-crystal plane.

7. A diamond semiconductor device according to claim 1, wherein said diamond crystal grain grown from said single nucleus comprises multi-twin-crystal grains composed of between 5 and 20 single crystals each having a {1,1,1} plane as a twin-crystal plane.

8. A diamond semiconductor device according to claim 1, wherein said insulating substrate comprises at least one material selected from the group consisting of quartz, glass, $Al_2O_3$, Mgo, $ZrO_2$, $SrTiO_3$ and $CaF_2$.

9. A diamond semiconductor device according to claim 1, wherein said insulating substrate is stable at a temperature range from 500° C. to 900° C.

10. A diamond semiconductor device having a diamond crystal semiconductor comprising:

a diamond crystal grown from a single nucleus at a pre-determined location on an insulating substrate, and which functions as a luminescence layer; and an insulating layer formed on said diamond crystal, a first electrode and a second junction electrode separately formed on said insulating layer and means for applying a forward voltage between said electrodes, whereby electroluminescene takes place in said diamond crystal.

11. A diamond semiconductor device having a diamond crystal semiconductor comprising a diamond crystal grown from a single nucleus at a pre-determined location on an insulating substrate, and which functions as a luminescence layer, wherein said diamond crystal grown on said single nucleus comprises a spinel twin-crystal grain in which a {1,1,1} plane serves as a twin-crystal plane.

12. A diamond semiconductor device having a diamond crystal semiconductor comprising a diamond crystal grown from a single nucleus at a pre-determined location on an insulating substrate, wherein said diamond crystal grown on said single nucleus comprises multi-twin-crystal grains composed of between 5 and 20 single crystals each having a {1,1,1} plane as a twin-crystal plane.

* * * * *

UNITED STATES PATENT AND TRADEMARK OFFICE
CERTIFICATE OF CORRECTION

PATENT NO. : 5,541,423

DATED : July 30, 1996

INVENTOR(S) : KEIJI HIRABAYASHI

It is certified that error appears in the above-identified patent and that said Letters Patent is hereby corrected as shown below:

Title page;
[56] REFERENCES CITED

U.S. PATENT DOCUMENTS, Insert --5,051,785 9/1991 Beetz, Jr. et al.--.
    U.S. PATENT DOCUMENTS, "Shidmi et al." should read Shiomi et al.--.
    FOREIGN PATENT DOCUMENTS, Insert --2240428 7/1991 United Kingdom.
    OTHER PUBLICATIONS, Insert -- Gildenblat, et al., "Electrical characteristics of Schottky diodes fabricated using plasma assisted chemical vapor deposited diamond films", Appl. Phys. Ltrs., No. 7, August 15 (1988)--

[57] ABSTRACT

Line 9, "minescene" should read --minescence--.

COLUMN 1

Line 34, "a" should be deleted.
    Line 35, "applied" should read --Applied--.
    Line 44, "a" should be deleted.

UNITED STATES PATENT AND TRADEMARK OFFICE
CERTIFICATE OF CORRECTION

PATENT NO. : 5,541,423

DATED : July 30, 1996

INVENTOR(S) : KEIJI HIRABAYASHI

Page 2 of 4

It is certified that error appears in the above-identified patent and that said Letters Patent is hereby corrected as shown below:

COLUMN 2

```
    Line 11, "a" should be deleted.
    Line 17, "ploy crystalline" should read
       --poly-crystalline--.
    Line 29, "tures" should read --ture--.
    Line 35, "poly crystalline" should read
       --poly-crystalline-- and "an" should be deleted.
```

COLUMN 3

```
    Line 38, "into" should read --into the--.
    Line 56, "than" should read --than an--.
    Line 57, "phosphorous" should read --phosphorus--.
```

COLUMN 4

```
    Line 25, "10³¹⁵" should read --10⁻⁵--.
    Line 34, "of" (first occurrence) should read --for--.
```

COLUMN 5

```
    Line 9, "employing" should read --employing a--.
    Line 16, "as" (first occurrence) should read --as the--.
```

UNITED STATES PATENT AND TRADEMARK OFFICE
CERTIFICATE OF CORRECTION

PATENT NO. : 5,541,423

DATED : July 30, 1996

INVENTOR(S) : KEIJI HIRABAYASHI

It is certified that error appears in the above-identified patent and that said Letters Patent is hereby corrected as shown below:

COLUMN 6

Line 55, "and" should read --and ultraviolet--.

COLUMN 7

Line 3, "a" should be deleted.
    Line 58, "D.C. voltage." should read --D.C. voltage,--.
    Line 59, "D.C.and" should read --D.C. and--.

COLUMN 11

Line 4, "are" should read --is--.
    Line 30, "Tort." should read --Torr.--.

COLUMN 12

Line 8, "are" should read --is--.

COLUMN 13

Line 34, "a" should read --an--.

UNITED STATES PATENT AND TRADEMARK OFFICE
CERTIFICATE OF CORRECTION

PATENT NO. : 5,541,423

DATED : July 30, 1996

INVENTOR(S) : KEIJI HIRABAYASHI

It is certified that error appears in the above-identified patent and that said Letters Patent is hereby corrected as shown below:

<u>COLUMN 14</u>

Line 5, "a" (first occurrence) should read --an--.

Line 44, "electroluminescene" should read --electroluminescence--.
Line 51, "electroluminescene" should read --electroluminescence--.
Line 57, "A" should read --a--.
Line 59, "a" should read --an--.
Line 67, "as" should read --serves as--.

<u>COLUMN 15</u>

Line 9, "Mgo," should read --MgO,--.

Signed and Sealed this

Eighth Day of April, 1997

*Attest:*

BRUCE LEHMAN

*Attesting Officer*   Commissioner of Patents and Trademarks